United States Patent [19]

Cases et al.

[11] 4,395,646
[45] Jul. 26, 1983

[54] LOGIC PERFORMING CELL FOR USE IN ARRAY STRUCTURES

[75] Inventors: Moises Cases, Delray Beach; Wayne R. Kraft, Coral Springs; Victor S. Moore, Deerfield Beach; William L. Stahl, Jr., Coral Springs; Nandor G. Thoma, Boca Raton, all of Fla.

[73] Assignee: International Business Machines Corp., Armonk, N.Y.

[21] Appl. No.: 203,170

[22] Filed: Nov. 3, 1980

[51] Int. Cl.³ .............. H03K 19/017; H03K 19/094; H03K 19/177

[52] U.S. Cl. ............................. 307/468; 307/448; 307/481; 364/716

[58] Field of Search ............... 307/444, 453, 468, 481, 307/304, 445, 448; 364/716; 340/166 R; 365/189

[56] References Cited

U.S. PATENT DOCUMENTS

| | | | |
|---|---|---|---|
| 3,974,366 | 8/1976 | Hebenstreit | 307/468 |
| 4,041,459 | 8/1977 | Horninger | 307/468 |
| 4,207,616 | 6/1980 | Heeren | 307/468 |
| 4,245,324 | 1/1981 | Machol et al. | 307/468 |

*Primary Examiner*—John Zazworsky
*Attorney, Agent, or Firm*—Harold H. Sweeney, Jr.

[57] ABSTRACT

A logic performing cell for use in array structures is provided which allows greater density fabrication in integrated circuits and reduces operational delays. The array has a plurality of output lines intercepted by a plurality of orthogonally oriented input lines, with elements in the form of a three terminal device located at each of the intersections of the input and output lines so that logical functions are performed on interrogation signals placed on the input lines and the responses thereto placed on the output lines. The three terminal device transfer gates are connected in groups of series strings which are connected in parallel to a recombination line. These groups of series connected transfer gates comprise a programmed mix of enhancement and depletion devices. Each logic function of each group of transfer gates establishes an output which, when coupled to the recombining output circuit line, provides an overall logic function for the logic performing cell.

6 Claims, 6 Drawing Figures

LOGIC PERFORMING CELL FOR USE IN ARRAY STRUCTURES

BACKGROUND OF THE INVENTION

This invention relates to logic performing cells for use in array structures, and more particularly, to a logic performing cell in which the cell operational delay is reduced and the cell size is diminished by a reduction of the number of diffusion contacts utilized therein as well as the elimination of the ground diffusion.

DESCRIPTION OF PRIOR ART

The performance of logic in arrays of identical circuit elements, each located at a unique intersection of an input and output line in a grid of intersecting input and output lines, is well known. It is also well known that the standardization of logic circuit layouts stemming from the use of logic matrices or arrays results in simplification and acceleration of the design and manufacture of monolithic chips containing logic performing circuits. However, up until now, the use of the logic arrays has been limited. A major cause in this limited use has been that a considerable amount of space is occupied on the chip by the large number of contact diffusions in each circuit cell. These contact diffusions are the connections made between the 3-element gate in the input and output lines of the matrix. Another feature limiting the space occupied by the matrix is the necessity for providing a ground conductor in connection with the matrix for connecting the source element of the 3-element devices in each circuit cell to a reference potential. This results in inefficient use of the surface area of the chip on which the arrays are fabricated. It turns out that, for most applications, design and manufacturing efficiency of logic arrays are outweighed economically by their inefficient use of chip area and it is less expensive to spend additional time and effort to design and manufacture logic chips without highly customized layouts that are less orderly than logic arrays but perform far more logic functions in a given area of a monolithic chip.

A number of schemes have been devised to provide more dense arrays on logic array chips. One such scheme is to share contacts as much as possible. This is accomplished by initially building the array such that elements requiring diffusion contacts will be adjacent to one another and can share the same contacts. The IBM Technical Disclosure Bulletin, Vol. 22, No. 8B, January 1980, discloses a dense read only storage which utilizes strings of field-effect transistors that are connected between source and drain islands. Bit states for locations along a string are established by selectively forming depletion-mode or enhancement-mode FET's. The state of a given location is detected by raising the voltages of all the gate lines except the one for the location of interest and then sensing for the presence or absence of continuity between source and drain islands. Such an arrangement does not indicate that a string of FET's using enhancement and depletion devices programmed to provide a logical function can be adapted to a logic array nor does the arrangement suggest that the circuit cell can be packaged such that the circuit delay is diminished.

Therefore, the main object of the present invention is to provide a logic circuit cell in which the delay is reduced.

It is another object of the present invention to increase the packaging density of a logic array on a chip using the logic forming circuit cell.

It is another object of the present invention to reduce the number of diffusion contacts in a logic forming cell.

It is a further object of the present invention to eliminate the diffusion ground in each cell of a logic array.

SUMMARY OF THE INVENTION

In accordance with the present invention, a logic performing cell for use in array structures is provided which provides for greater density fabrication and which reduces operational delays. The array has a plurality of output lines intercepted by a plurality of orthogonally oriented input lines, with elements in the form of a three terminal device located at each of the intersections of the input and output lines so that logical functions are performed on interrogation signals placed on the input lines and the responses thereto placed on the output lines. The three terminal devices are connected in series in a plurality of groups. Each group is connected to a recombining output circuit line in parallel. Each group of series connected transfer gates comprises a programmed mix of enhancement and depletion transfer gates establishing a logic function in conjunction with the intersecting signal line inputs. Each logic function of each of the logic circuits established an output which, when coupled to the recombining output circuit line, provides an overall logic function for the logic performing cell.

BEST MODE FOR CARRYING OUT THE INVENTION

Figure 1:
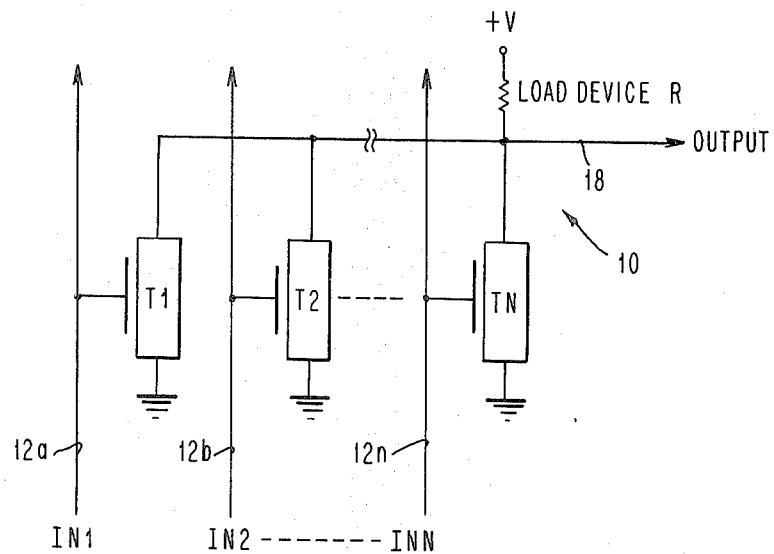
FIG. 1 is a schematic circuit drawing showing an "AND" array cell of the prior art (assuming negative logic inputs).

Referring to FIG. 1, there is shown a prior art AND array 10 which receives positive input signals IN1, IN-2-INN on parallel input lines 12a, 12b–12n which connect to the respective gates of transistors T1, T2–TN. The input signals IN1–INN represent the true or complement of input variables. Arranged orthogonally with respect to the input lines is an output line 18. When the cell is used in a logic array, there are a plurality of such output lines 18 parallel to one another. Located at the intersections of the input and output lines are logic performing devices, such as three element devices T1, T2–TN that will perform a logic operation. In the case as shown in FIG. 1, an AND function is provided on data placed on the input lines 12a, 12b–12n and the result is provided on the output line 18. For instance, when IN1, IN2-INN inputs are low, the three element devices T1, T2-TN are not rendered conductive and the output line 18 goes high (+V). Therefore, the circuit represents a negative logic AND invert. It should be appreciated that the input signals IN1-INN, if any one is high, would render the corresponding three element device T1-TN conducting and, therefore, the output line would be brought low providing a positive logic OR invert logic array in which the three element devices are connected, as shown in FIG. 1, that is, the drain connected to the output, the source connected to ground, and the input line connected to the gate of the device. The arrangement is ideally suited for fabrication in integrated circuit form wherein the three element device is a channel field effect transistor, or the like. The manner in which these logic elements may be utilized to perform various types of logic functions is documented in many of the well-known books pertaining to the utilization and design of logic circuits.

Figure 2:
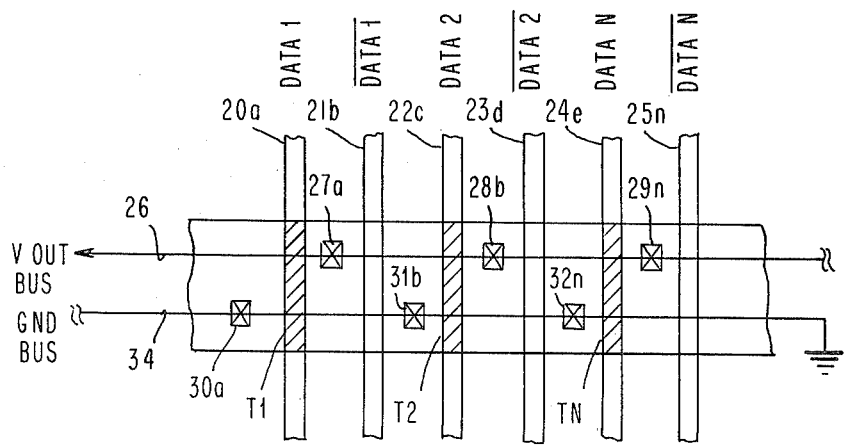
FIG. 2 is a schematic diagram of an integrated circuit layout of the "AND" array shown in FIG. 1.

FIG. 2 shows an array portion of a logic array showing the data input lines 20a, 21b-25n as polysilicon gate lines and the output bus 26 and the ground bus 34. It should be noted that each of the transistors T1, T2-TN has associated therewith a respective diffusion contact 27a, 28b-29n connected to the output bus 26 representing the connection of the drain of the device to the output bus and a similar diffusion contact 30a, 31b and 32n connected to the ground bus 34. It can be seen that a cell requires at least two diffusion contacts as well as a ground bus. The present invention arranges the array cell such that the number of diffusion contacts is reduced and the ground bus is eliminated.

Figure 3:
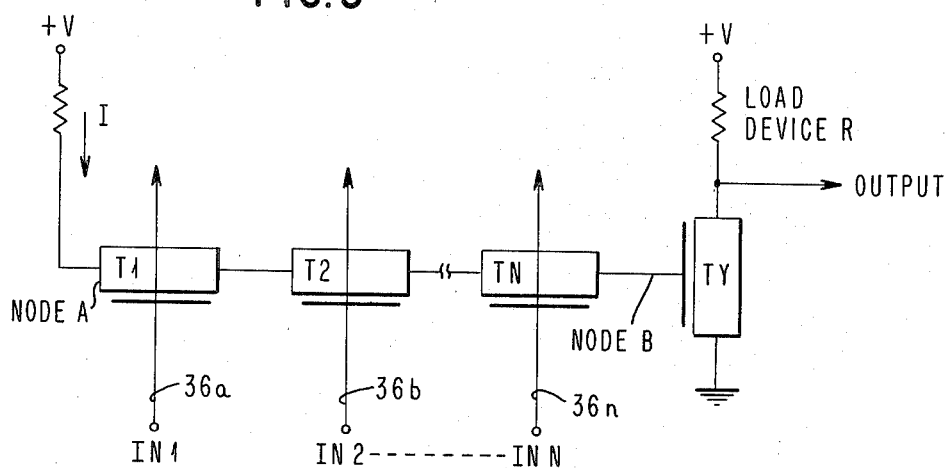
FIG. 3 is a schematic circuit diagram showing an "AND" array in which the transfer gates are serially connected.

The above problems and disadvantages in the prior art are overcome by packaging the cell as is shown in FIG. 3. The parallel input lines 36a, 36b-36n are polysilicon gate lines. These input lines form part of the transistor where they cross the diffusions. The field effect transistors, T1-TN are connected in a series, that is, with the drain of each transistor connected to the source of the adjacent transistor to form a series string of FET's. The drain of the first device T1 is connected to a charge source and the source of the last transistor TN is connected to the gate of transistor TY. Resistor R represents the load device in the output from the drain of TY. The FET devices are either enhancement or depletion mode devices, with the depletion mode device representing a logical one in the AND configuration and the logical 0 in the OR configuration. The string of series connected FET's is shown connected between node A and node B of FIG. 3. It should be appreciated that the maximum voltage amplitude propagated through the cell is equal to the threshold of the depletion mode device, about 2.5 volts. This arrangement eliminates the need to connect every array transistor to a metal output line and a diffusion ground line. The need for contacts in the array is reduced because the source of T1 is a diffusion as is the drain of T2 etc., in fact the diffusions are common and we get an automatic interconnection for series transistors.

The performance of the array cell, as shown in FIG. 1, is dictated by the total capacitance at the output node, and may be adjusted somewhat by increasing the size of the array devices at the expense of area.

The array cell, shown in FIG. 3, has the performance dictated by the magnitude of the current source as well as device size. However, rather than a linear growth of time delay as in the first case, here it is nonlinear. If a unit delay is $\tau n$ then in the limit the total delay is equal to $N^2 \tau n$ as in a distributed transmission line instead of a linear $N \tau n$. N is the number of transistors. The situation is complicated some what by the fact that in the AND array both the true and complement of any input signal must be made available and decodeable.

In a process such as used for making FET's a transistor is formed when a polysilicon gate line orthogonally intersects a thin oxide region. Diffusions are formed whenever the oxide is not covered by the polysilicon. This can be appreciated from FIG. 4 which shows the intersection of the polysilicon lines and the diffusion.

If one vertical polysilicon input line 40 carries the true input data and the other complement input data, and if the output is removed from either end of the diffusion 42, it is necessary to remove one or both of the signals from taking part in the output equation.

Figure 4:
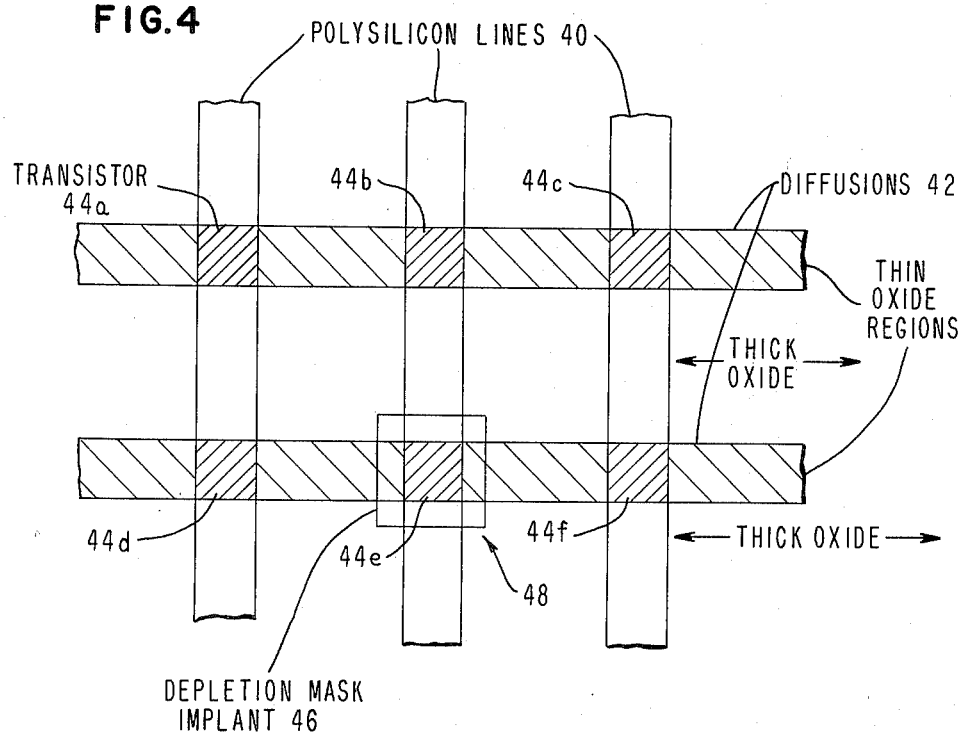
FIG. 4 is a schematic representation of an integrated circuit layout of six transistors showing a depletion implant mask.

One direct way to do this is to remove the unwanted transistors 44 by turning it on all of the time so that the voltage level of the gate does not matter to the equation. This is done by making the device a depletion transistor via another mask 46 called an implant mask as depicted in FIG. 4. This shifts the device characteristics such that the turn off threshold is negative, for example, about minus 2.5 volts, and since we are swinging the gate positive, for example, between 0.0 volts and 5.0 volts the transistor never shuts off. The current carrying capability of the device 48 is low at low gate voltages, which now is the normal mode of operation. Since R and C in the series connected line of FET's has not changed, but the current has decreased, the propogation time has increased considerably. This can be compensated for by breaking up the total equation or product term as it is more commonly known, and then recombining the resultant in some fashion. For example, if one of the output lines 42 containing the series connected transfer devices 44 and 48 is divided into two parts, the resultant decrease in propogation time is ¼. The dividing into groups allows logical function within the array to proceed in parallel fashion.

Figure 5:
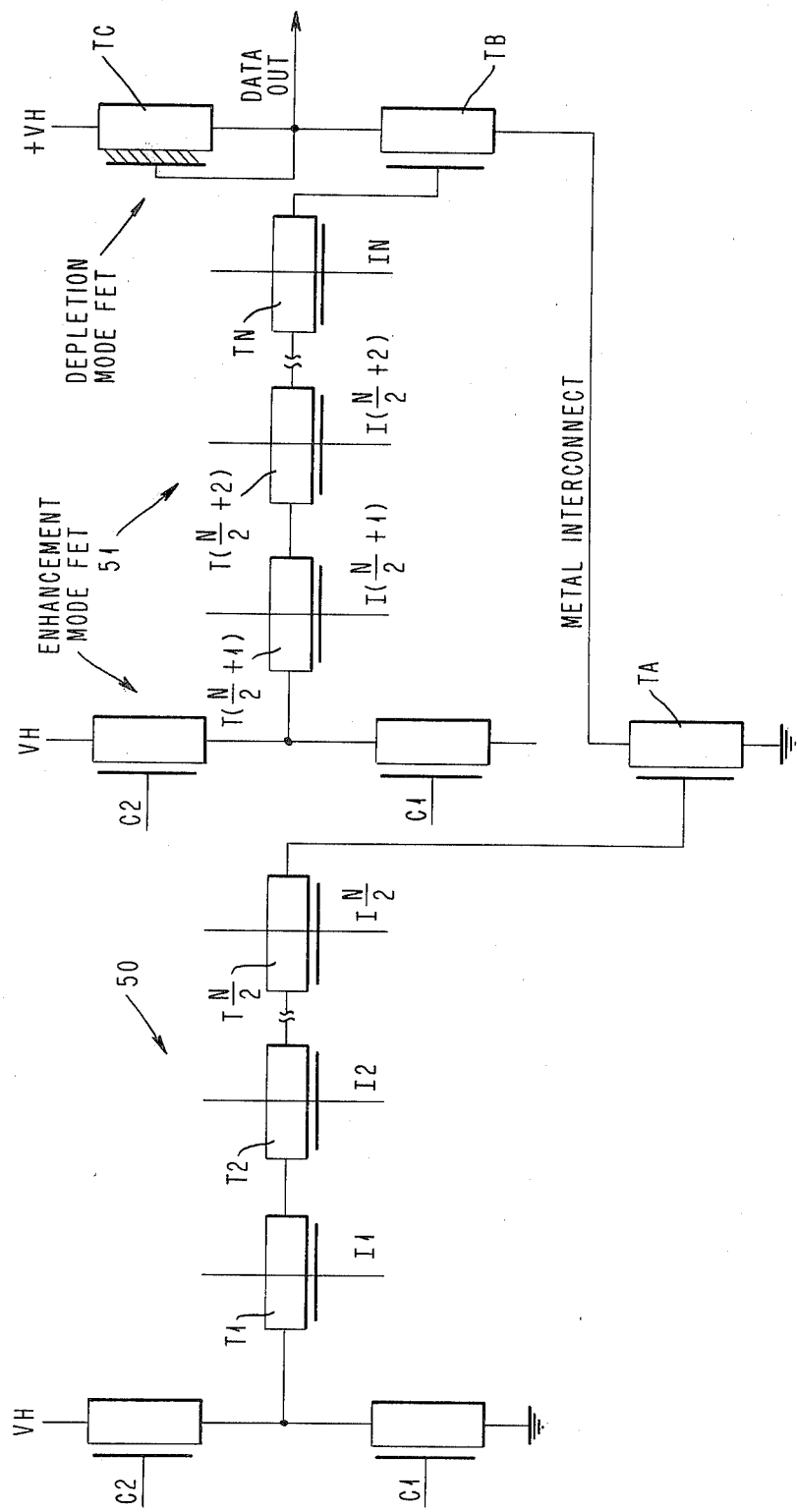
FIG. 5 is a schematic circuit diagram showing the transfer gates connected in series in parallel groups performing an AND invert logical function on the parallel groups.

Referring to FIG. 5, there is shown an array cell in which the long string of series connected transfer gates are broken into two groups, 50 and 51. Each group consists of a plurality of series connected transfer gates T1, T2-TN/2 and T(N/2+1)-TN, respectively, which are arranged in parallel to perform the AND function. Transistors TA, TB and TC form the AND invert function. If the charge VH travels through T1, T2, and TN/2 it is sufficiently high to turn on transistor TA. More specifically, if the inputs of a group, for example, the inputs I1, I2-IN/2 cause the associated transistor T1, T2-TN/2 to conduct, then the charge VH applied at the clock time C2 will be passed through each transistor T1-TN/2 turning on transistor TA. Similarly transistor TB will be turned on by the VH voltage passed through conducting transistors T (N/2+1)-TN. It should be noted that TC is a depletion mode device and is biased to be continuously in the conducting condition. The transistor TA has its source connected to ground and its drain connected to the source of transistor TB. Accordingly, when the transistors TA and TB are simultaneously biased to the on or conducting condition node E, forming the output of the cell, will drop giving a down level output. It should be appreciated that the transitors TA, TB and TC in conjunction with the groups of series connected strings of devices provides an AND-INVERT function.

The logic array cell described above can be easily incorporatd into larger arrays such as programmed logic arrays (PLA's). It is well known in PLA's to perform logic in a compound arrangement of arrays by using the output of one array as the input to another array. A number of decoders feed inputs to a first array called a product term generator, or an AND array, which in turn supplies outputs to a second array called a sum of product term generator, or an OR array. The outputs of the OR array are then used to control the setting and resetting of a string of latches so that both combinatorial and sequential logic functions can be performed by the PLA. The particular logic functions actually performed by the given PLA are controlled by the locations and number of the actual logic circuits in the AND and OR arrays of the PLA and also by how inputs are supplied to the decoders from off the chip or from the latches.

Figure 6:
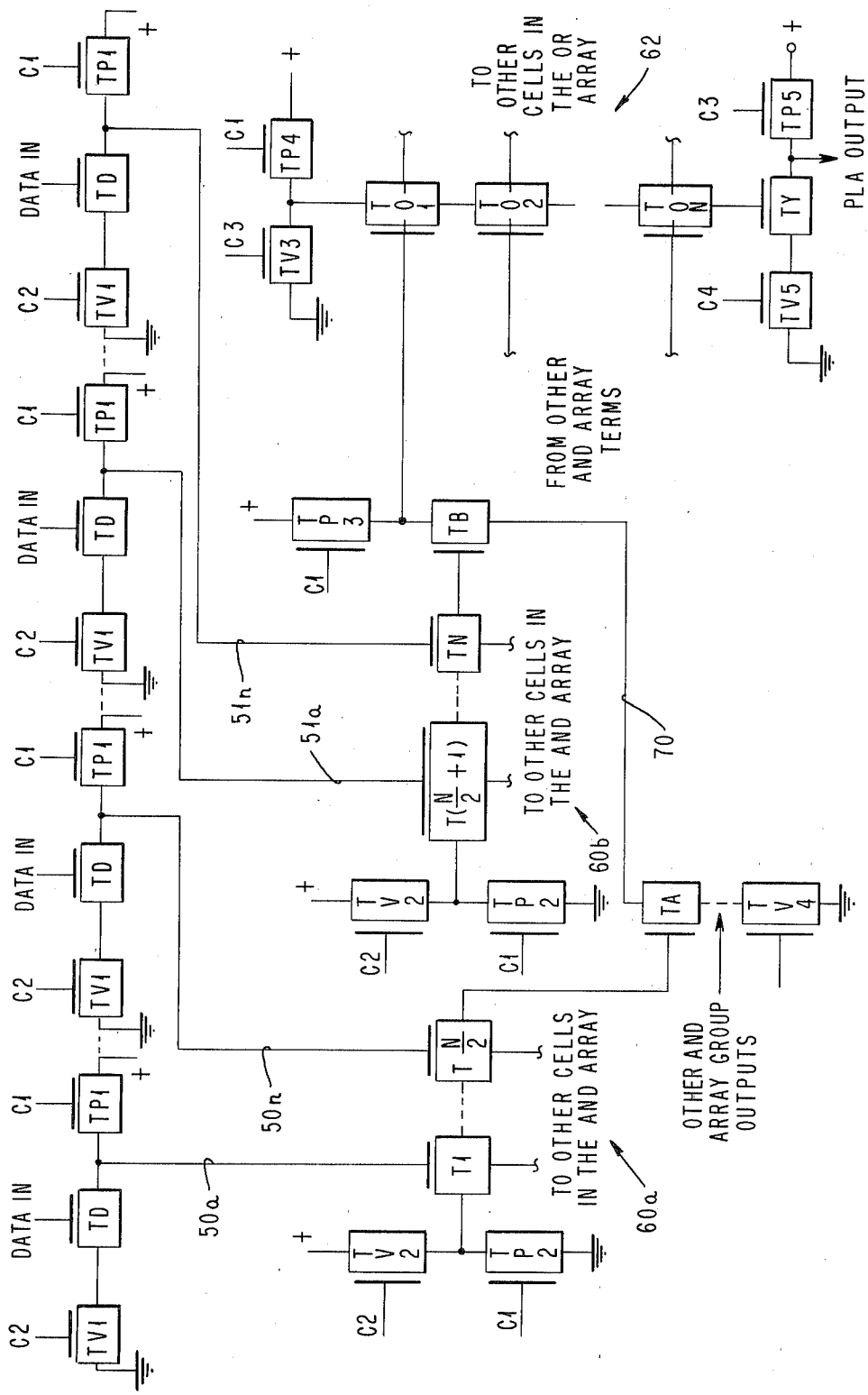
FIG. 6 is a schematic circuit diagram showing a programmed logic array in which the transfer gates are connected in series in separate groups and showing the "OR" array connected thereto.

In FIG. 6 an AND array cell 60a and 60b embodying the present invention is shown feeding an OR array 62 similar to the cell arrangements in the PLA. Actually, the OR array 62 may be broken into parallel groups similar to the grouping 60a, 60b of the the AND array.

The AND array portion of the PLA consists of a first group of transistors T1, T2-TN/2. The second group of transistors consists of T(N/2+1), T(N/2+2)-TN. The transistors are the well known FET's. The input data for determining the cell to be an AND array is applied to the gates of the FET's via input lines 50a-50n for the first group of transistor devices and input lines 51a-51n carrying the data for the second group in the AND array. These same polysilicon gate lines form the corresponding input lines to other cells in the AND array. The output from the AND array cell is taken from node 60 and is applied to the gate of transistor TO1 of the OR array. Similarly, the other transistors TO2 through TON of the OR array have their gates connected to the outputs from other AND array terms in the PLA.

In operation, the PLA requires a multi-phase clock (not shown). Actually, a four phase clock C1-C4 is required, since the following functions have to be performed: (1) the AND array and the OR array must be precharged; (2) the AND array must be validated; (3) the OR array must be validated and the output must be precharged; and (4) the output must be validated. Clock C1 precharges the AND array gates of FET's T1-TN to a high voltage by rendering TP1 conducting in each group of AND arrays 60a, 60b. Simultaneously, the lines consisting of the series connected transistor devides T1, T2-TN are discharged. This is accomplished via FET TP2 which is rendered conducting providing a ground for the connected lines. C2 validates the input data, quickly discharging the AND input lines containing the series strings of FET's by renderng TV1 conducting. C2 also validates the AND array by causing TV2 to conduct. C1 precharges the OR array inputs as well as charging the OR transfer paths through TO1, TO2-TON via TP4. C3 validates the OR array input data, and tries to discharge the OR conductive channel through TV3. It also precharges the output circuit through TP5. C4 validates the PLA output. It will be appreciated that the PLA consists of a number of AND array terms similar to the one in FIG. 6 and a number of OR array terms. It should also be appreciated that each OR array term may be grouped similar to the grouping of the AND array term to reduce the time delay through the array. The output of the first grouping 60a in the AND array is shown coupled to an output line 70, or a combining line, with the output from the second group 60b of the AND array. This combining of the outputs of the groups of the AND array forms an AND invert function at the output node 60.

While we have illustrated and described the preferred embodiment of our invention, it is to be undestood that we do not limit ourselves to the precise constructions herein disclosed and the right is reserved to all changes and modifications coming within the scope of the invention as defined in the appended claims.

What is claimed is:

1. A logic performing cell for use in array structures comprising:
   a plurality of parallel connected logic circuits;
   an output circuit line in each parallel connected logic circuit;
   a plurality of field effect transistors including at least a first and last field effect transistor connected in series in said output circuit line in each parallel connected logic circuit;
   a plurality of input data circuit lines intersecting said output circuit line and adapted to receive input control signals;
   a gate terminal formed in each of said field effect transistors at said intersecting of a respective one of said input data circuit lines with said output circuit line for introducing control signals establishing a logic function for each of said parallel connected logic circuits;
   a recombining circuit for recombining the logic functions for each of said parallel connected logic circuits;
   an output circuit for said recombining circuit;
   coupling means for coupling each of said parallel connected logic circuits to said recombining output circuit;
   a charge means for each of said parallel connected logic circuits;
   a drain and a source terminal formed in each of said field effect transistors;
   connecting means connecting said drain and source terminal of adjacent field effect transistors in each of said parallel connected logic circuits together and for connecting the drain terminal of said first field effect transistor in each of said parallel connected logic circuits to said charge means and the source terminal of said last field effect transistor in each of said parallel connected logic circuits to said coupling means.

2. A logic performing cell for use in array structures according to claim 1, wherein said plurality of input data circuit lines are each made of polysilicon and said output circuit line in each parallel connected logic circuit consists of a thin oxide region, said intersecting of said polysilicon input data circuit lines over said thin oxide region output circuit line forming said field effect transistors.

3. A logic performing cell for use in array structures according to claim 2, wherein said connecting means for said field effect transistors in each of said parallel connected logic circuits comprise said thin oxide region of said output circuit line adjacent said field effect transistors.

4. A logic performing cell according to claim 1, wherein said coupling means for coupling each of said logic circuits to said recombining output circuit comprises a further field effect transistor, a gate, source and drain terminal formed in each of said further field effect transistors, said charge means providing a charge to said series connected field effect transistors resulting in a charge at said gate of said further field effect transistor.

5. A logic performing cell according to claim 4, wherein said recombining circuit includes at least a first and last further field effect transistor for coupling each logic circuit thereto and having the drain of one further field effect transistor connected to the source of the next further field effect transistor, the first further field effect transistor in said recombining circuit having the source terminal connected to ground and the last further field effect transistor having its drain connected to said output circuit.

6. A logic performing cell according to claim 1, wherein said output circuit for said recombining circuit includes a depletion mode field effect transistor biased to be continually in the conducting condition, said depletion mode field effect transistor comprising a drain terminal connected to a charge source and a source terminal connected to said output circuit so that said output drops to a low output value when all of said coupling means are conducting and remains at a high value when one or more of said coupling means are not conducting.

* * * * *